United States Patent [19]

Lur et al.

[11] Patent Number: 5,472,903
[45] Date of Patent: Dec. 5, 1995

[54] ISOLATION TECHNOLOGY FOR SUB-MICRON DEVICES

[75] Inventors: Water Lur, Taipei; Cheng-Han Huang, Hsin-chu, both of Taiwan

[73] Assignee: United Microelectronics Corp., Hsin-Chu, Taiwan

[21] Appl. No.: 247,989

[22] Filed: May 24, 1994

[51] Int. Cl.$^6$ ................................................. H01L 21/76
[52] U.S. Cl. .................... 437/67; 437/72; 437/968
[58] Field of Search ........................... 437/67, 72, 968; 198/DIG. 85, DIG. 86, DIG. 80, DIG. 117

[56] References Cited

U.S. PATENT DOCUMENTS 4,666,556  5/1987  Fulton et al. .

FOREIGN PATENT DOCUMENTS

| 56-94646 | 7/1981 | Japan . |
|---|---|---|
| 58-54651 | 3/1983 | Japan . |
| 58-87843 | 5/1983 | Japan . |
| 58-161342 | 9/1983 | Japan . |
| 58-164240 | 9/1983 | Japan . |
| 130271 | 2/1989 | Japan . |

OTHER PUBLICATIONS

Kurosawa et al., *A New Bird's –Beak Free Field Isolation for VLSI Devices*, International Electron Devices Meeting, Dig. Tech, Paper, pp. 384–387 (1981).

Rung et al., *Deep Trench Isolated CMOS Devices*, International Electron Devices Meeting, Digest Technical Paper, pp. 237–240 (1982).

Katsumata et al., *Sub–20 ps ECL Bipolar Technology with High Breakdown Voltage*, ESSDERC (Sep. 1993).

Lutze et al., *Electrical Limitations of Advanced LOCOS Isolation for Deep Submicrometer CMOS*, IEEE Transactions on Electron Devices, vol. 38, No. 2 (Feb., 1991).

Poon et al., *A Trench Isolation Process for BiCMOS Circuits*, IEEE Bipolar Circuits and Technology Meeting 3.3 (1993).

*Primary Examiner*—George Fourson
*Attorney, Agent, or Firm*—Meltzer, Lippe, Goldstein et al.

[57] ABSTRACT

A new isolation technology fabrication process is provided including the step of forming a trench in a semiconductor material. Then, several poly walls are formed in the trench. The poly walls are oxidized to form a single oxide isolation region filling the trench.

8 Claims, 2 Drawing Sheets

ISOLATION TECHNOLOGY FOR SUB-MICRON DEVICES

FIELD OF THE INVENTION

The present invention relates to isolation regions in sub-micron semiconductor devices.

BACKGROUND OF THE INVENTION

Much research is currently being performed in the area of packing semiconductor devices and components into a single substrate. For example, much research and development has been performed in sub-micron or fine line photolithographic fabrication processes which enable the manufacture of very small semiconductor components.

As semiconductor devices and components are packed together with higher densities on a single substrate, it is often desirable to electrically isolate each component or groups of components from each other. One way to electrically isolate components is to form oxide isolation regions which serve to eliminate junction leakage between different isolated component groups. FIG. 1 illustrates a prior art LOCOS (local oxidation of silicon) process for forming an oxide isolation region. In a step (a), a thin $SiO_2$ oxide layer 12 is grown on a silicon (Si) substrate 10. Then, a patterned $Si_3N_4$ layer 14 is formed on the $SiO_2$ layer 12. The $Si_3N_4$ layer 14 is patterned (for example, using a photo-lithographic technique) to form $Si_3N_4$ mesas 14a, 14b adjacent to an exposed window 16 of the $SiO_2$ layer 12. The window 16 has the approximate desired dimensions, and is disposed in the approximate desired location of the oxide isolation region.

As shown in step (b), a channel stop 19 is formed in the substrate 10 surface below the window 16, for example, using an ion implantation technique. Then, in step (c), a field oxide 18 is formed in the substrate 10 surface below the window 16 by heating the substrate in an oxygen environment for a particular period of time. As shown, the field oxide isolation region thus formed has "bird's beak" shaped trailing edges 18a and 18b. In step (d), the $Si_3N_4$ layer 14 is stripped from the substrate 10 and field oxide 18 surface. Then in step (e), sacrificial oxide growth and stripping are performed in order to overcome the "white ribbon effect".

The prior art LOGOS process of FIG. 1 has a number of disadvantages:

(1) Birds beaks 18a and 18b are formed in the field oxide 18 isolation region. The bird's beaks 18a and 18b are caused by lateral oxidation of the Si substrate 10 along the thin oxide layer 12 under the $Si_3N_4$ layer 14 (which results from high temperature oxidation for a long time).

(2) A "white ribbon effect" is produced in the substrate 10 and $SiO_2$ region 18 and layer 12. The white ribbon effect is caused by the diffusion of nitrogen from the compressive stressed $Si_3N_4$ layer 14 into the adjacent tensile stressed Si substrate 10 and $SiO_2$ field oxide isolation region 18 and oxide layer 12.

(3) The thickness of the field oxide 18 is thinned in the smaller openings 16a, 16b. This thinning effect is caused by a reduced oxygen gas flow into smaller sized LOCOS openings of the substrate 10 under the $Si_3N_4$ mesas 14a and 14b.

(4) The field oxide isolation region 18 is not completely recessed within the substrate 10, but rather bows out and protrudes from the surface. This is due to the inherent increase in volume when the Si substrate 10 is oxidized to form $SiO_2$. Furthermore, after the $Si_3N_4$ layer 14 is stripped, there is a relaxation of stress inside the field oxide isolation region 18 edges. Thus, a "bird's head" and "bird's neck" shaped edge is always present.

(5) The conventional LOCOS process has a thermal budget with a long oxidation time (for forming the field oxide isolation region 18). Generally, the field oxide 18 thickness is proportional to the square root of the oxidation time in the conventional LOCOS process. Thus, a long oxidation time is required.

(6) Significant crystal lattice defects are introduced in the substrate 10 around the field oxide isolation region 18. These defects are caused by the tremendous stresses resulting from the pressure of the increased volume of the field oxide isolation region 18 on the surrounding substrate 10. Such defects make it impossible to eliminate junction leakage.

It is therefore the object of the present invention to overcome the disadvantages of the prior art.

SUMMARY OF THE INVENTION

This and other objects are achieved by the present invention which provides a new isolation region technology. According to one embodiment, a process is provided including the steps of forming a trench in a semiconductor material (e.g., by etching), forming several walls of polycrystalline silicon (poly), and oxidizing the poly walls to form a single oxide region filling the trench.

DETAILED DESCRIPTION OF THE INVENTION

Figure 1A:
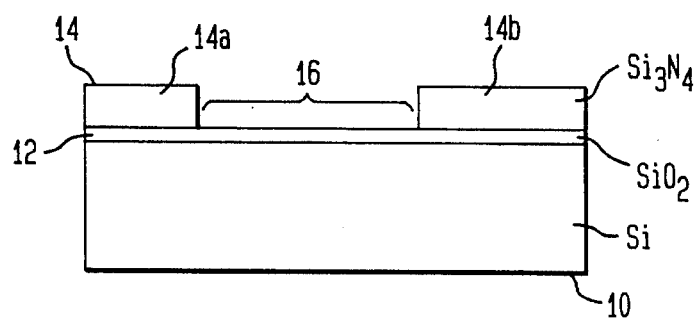
FIG. 1 illustrates a prior art LOCOS process for forming an oxide isolation region.
Figure 1B:
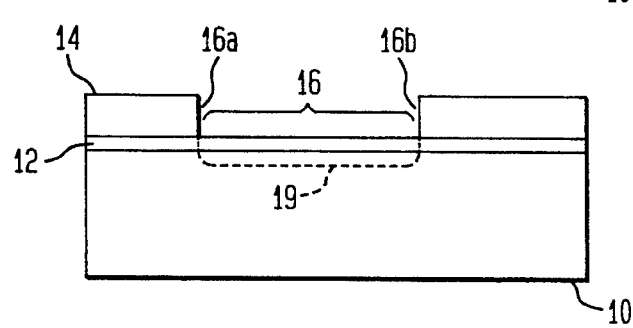
Figure 1C:
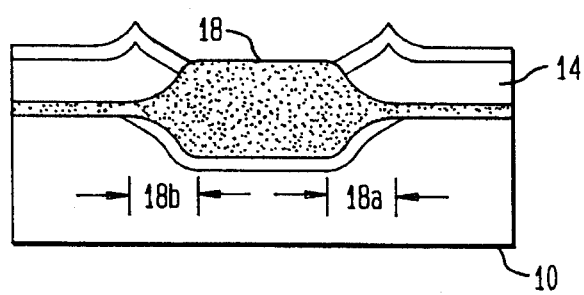
Figure 1D:
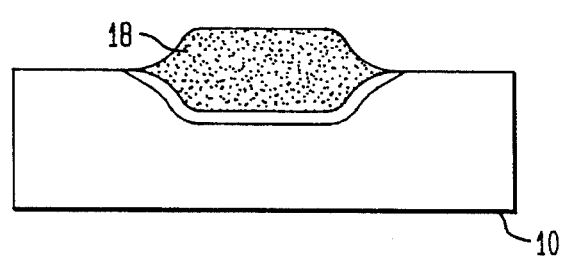
Figure 1E:
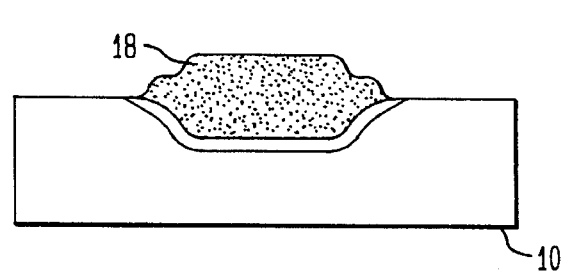
Figure 2A:
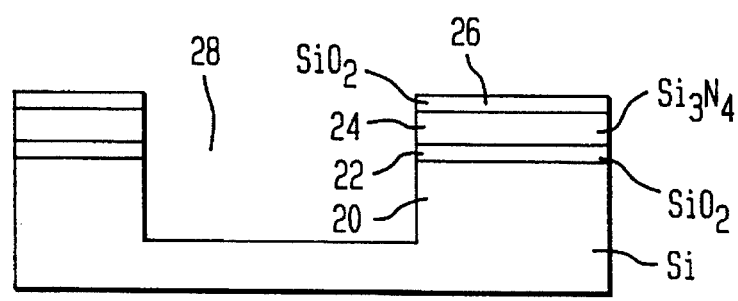
FIG. 2 illustrates a LOCOS process according to one embodiment of the present invention for forming an oxide isolation region.
Figure 2B:
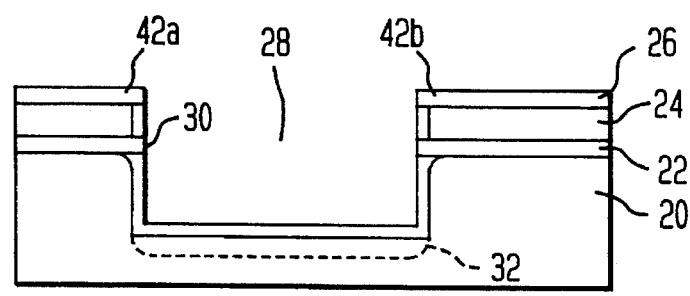
Figure 2C:
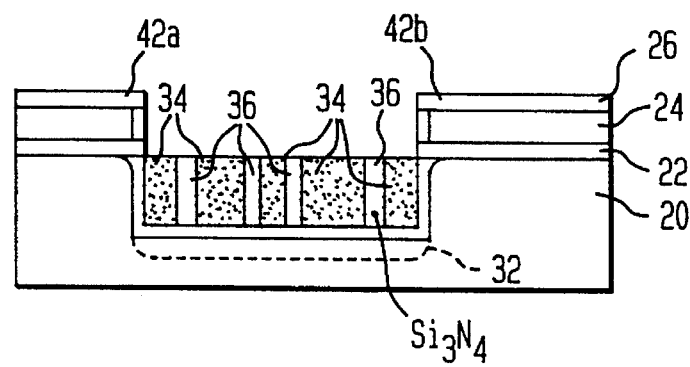
Figure 2D:
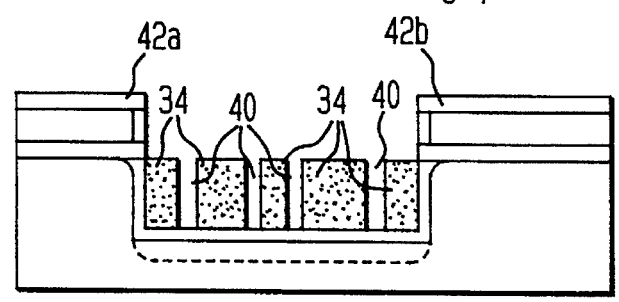
Figure 2E:
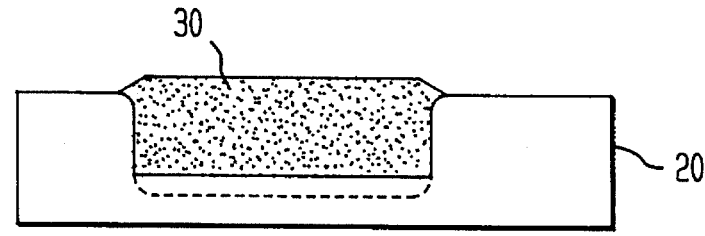

Referring to FIG. 2, a LOCOS process according to one embodiment of the present invention is shown. In a step (a), a $SiO_2$ layer 22 is formed on a substrate 20 (which is illustratively a Si substrate 20). A $Si_3N_4$ layer 24 is then formed on the $SiO_2$ layer 22. Another $SiO_2$ layer 26 is then formed on the $Si_3N_4$ layer 24. Illustratively, the thicknesses of the layers is as follows: $SiO_2$ layer 22 50–200 Å, $Si_3N_4$ layer 24 500–2000 Å, $SiO_2$ layer 26 500–1000 Å. A trench 28 is then etched through the layers 22–26 and into the substrate surface 20 (thereby forming $Si_3N_4$ mesas 24a, 24b). Illustratively, the trench depth is 4000–8000 Å.

Next, as shown in step (b), a thin oxide layer 30 is formed on the exposed horizontal and vertical surfaces of the substrate 20 and $Si_3N_4$ layer 24. As discussed in greater detail below, the purpose of the thin oxide layer 30 is to eliminate trench 28 etching damages and protect active mesa shoulders 42a and 42b. The thin oxide layer 30 also acts an an etching endpoint during the formation of poly walls 34 and $Si_3N_4$ spacers 36. Illustratively, this thin oxide layer 30 has a thickness of 300–800 Å. Thereafter, a channel stop 32 is implanted, i.e., ions are implanted in the trench surface 28 for forming a channel stop 32. In step (c), several poly walls 34 are formed in the trench 28. Illustratively, these walls are separated by $Si_3N_4$ spacers 36 which $Si_3N_4$ spacers 36 are used in to form the poly walls 34 according to the following sub-process. Several $Si_3N_4$ spacers 36 are first formed in the trench 28 which each have a width of 500–1200 Å and are laterally separated from each other by 1000–4000 Å. Then, the poly walls 34 are formed on the lateral edges of the $Si_3N_4$ spacers 36 using a nitrogen etching process. Illustratively, the poly walls each have a width in the range 1000–4000 Å. The sum total of all of the widths of the poly walls 34 illustratively equals approximately 77% of the width of the trench 28. The poly walls each have a height approximately equal to 80% of the depth of the trench 28.

In step (d), the $Si_3N_4$ spacers 36 are removed, either by reactive ion etching or a wet etching using $H_3PO_4$, leaving grooves 40. Next in step (e), the poly spacers 34 are oxidized to form the field oxide isolation region 38. The field oxide isolation region 38 occupies the volume of the poly walls 34 and the grooves 40. The $SiO_2$ and $Si_3N_4$ layers 22, 24 and 26 are then stripped from the substrate 20.

The inventive process of FIG. 2 has the following advantages:

(1) The formation of the bird's beak shaped edges in the field oxide isolation region 38 is minimized. This is because less time is used to oxidize the poly walls 34 to form the field oxide isolation region 38 than is required to form the isolation region 18 according to the conventional LOCOS process.

(2) The short oxidation time and stress-relieving grooves 40 separating the poly walls 34 substantially reduce the production of stress in the formation of the field oxide isolation region 38. The scarcity of stress in the process substantially reduces the white-ribbon effect.

(3) The grooves 40 also equalize the surface area of the poly walls 34 thereby providing a uniform oxygen gas flow during the formation of the field oxide isolation region 38. As a result, the field oxide isolation region 38 has a uniform thickness.

(4) The grooves 40 provide additional volume for the field oxide isolation region 38 (which has 1.3 times more volume than the total volume of the poly walls 34). Stated another way, using the aforementioned height and width criteria for the poly walls 34, the total volume of the field oxide isolation region 38 approximately equals the sum of the volumes of the poly walls 34 and the sum of the volumes of the grooves 40. As a result, the field oxide isolation region 38 is approximately entirely recessed within the trench 28.

(5) The thermal budget constraints are relaxed. This is because the oxidation time is set by the width of the poly walls 34 (which is approximately 1000–4000 Å). Because each poly wall 34 is relatively thin, only a short oxidation time is necessary to form the field oxide isolation region 38 from the poly walls 34.

(6) Crystal lattice defect generation in the substrate 20 is substantially reduced in the formation of the field oxide isolation region 38 by virtue of the grooves 40. Furthermore, trench etching damages are reduced, and the active mesa shoulders 42a and 42b are protected by the formation of the thin oxide layer 30.

In short, a new isolation technology and fabrication process are provided. According to one embodiment, a trench is formed in a semiconductor material. Then, several poly walls are formed in the trench. The poly walls are oxidized to form a single oxide isolation region filling the trench. Finally, the above discussion is intended to be merely illustrative. Numerous other embodiments may be devised by those having ordinary skill in the art without departing from the spirit and scope of the following claims.

We claim:

1. A process for fabricating a semiconductor comprising the steps of:

forming a trench in a semiconductor material, forming a plurality of spaced apart spacers in said trench, forming a plurality of spaced apart poly walls adjacent to sides of each of said spacers, etching said spacers, and oxidizing said poly walls to form a single oxide region filling said trench.

2. A process for fabricating a semiconductor comprising the steps of:

forming a trench in a semiconductor material, forming a plurality of spaced apart poly walls in said trench, and oxidizing said poly walls to form a single oxide region filling said trench, wherein said step of forming said spaced apart poly walls comprises the steps of:

forming at least one $Si_3N_4$ region in said trench, forming a plurality of poly walls on edges of said at least one $Si_3N_4$ region, and forming at least one groove separating said poly walls by etching said at least one $Si_3N_4$ region.

3. The process of claim 1 further comprising, prior to said step of forming a trench, the steps of:

forming a first $SiO_2$ layer on said semiconductor region, forming a $Si_3N_4$ layer on said first $SiO_2$ layer, and forming a second $SiO_2$ layer on said $Si_3N_4$ layer.

4. The process of claim 3 further comprising, after said step of forming said trench, the step of:

forming an oxide layer on a surface and exposed side walls of said trench.

5. The process of claim 1 wherein said single oxide region is approximately entirely recessed in said trench.

6. The process of claim 1 wherein said single oxide region is free of bird's beak shaped edges.

7. The process of claim 1 wherein the thickness of said single oxide region is approximately uniform.

8. The process of claim 1 wherein the volume of said single oxide region approximately equals the sum of the volume of said poly walls and the sum of the volume of space separating said poly walls.

\* \* \* \* \*